(12) United States Patent
Cheng et al.

(10) Patent No.: US 10,696,783 B2
(45) Date of Patent: Jun. 30, 2020

(54) RESIN COMPOSITION, PREPREG, AND COPPER CLAD LAMINATE

(71) Applicants: ITEQ Corporation, Xinpu Township, Hsinchu County (TW); Industrial Technology Research Institute, Hsinchu (TW)

(72) Inventors: Chen-Hsi Cheng, Xinpu Township (TW); Ming-Hung Huang, Xinpu Township (TW)

(73) Assignees: ITEQ CORPORATION, Xinpu Township, Shinchu County (TW); INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 134 days.

(21) Appl. No.: 15/857,403

(22) Filed: Dec. 28, 2017

(65) Prior Publication Data
US 2019/0194383 A1  Jun. 27, 2019

(30) Foreign Application Priority Data
Dec. 25, 2017 (TW) .............................. 106145515 A

(51) Int. Cl.
| | | |
|---|---|---|
| *B32B 15/092* | (2006.01) | |
| *B32B 15/082* | (2006.01) | |
| *B32B 27/30* | (2006.01) | |
| *B32B 27/38* | (2006.01) | |
| *C08L 63/00* | (2006.01) | |
| *C08L 71/12* | (2006.01) | |
| *C08K 9/02* | (2006.01) | |
| *C08G 61/10* | (2006.01) | |
| *C08J 5/24* | (2006.01) | |
| *C08K 3/013* | (2018.01) | |
| *C08K 3/04* | (2006.01) | |
| *C08K 3/14* | (2006.01) | |
| *C08K 3/28* | (2006.01) | |
| *C08K 3/34* | (2006.01) | |
| *C08K 5/17* | (2006.01) | |
| *C08K 5/3492* | (2006.01) | |
| *B32B 15/08* | (2006.01) | |
| *B32B 15/20* | (2006.01) | |
| *C08G 65/48* | (2006.01) | |
| *C09D 4/00* | (2006.01) | |
| *C08F 283/08* | (2006.01) | |
| *C08L 29/10* | (2006.01) | |
| *C08K 3/22* | (2006.01) | |
| *H05K 1/03* | (2006.01) | |

(52) U.S. Cl.
CPC ............. *C08G 61/10* (2013.01); *B32B 15/08* (2013.01); *B32B 15/20* (2013.01); *C08F 283/085* (2013.01); *C08G 65/485* (2013.01); *C08J 5/24* (2013.01); *C08K 3/013* (2018.01); *C08K 3/04* (2013.01); *C08K 3/14* (2013.01); *C08K 3/28* (2013.01); *C08K 3/34* (2013.01); *C08K 5/17* (2013.01); *C08K 5/34924* (2013.01); *C08L 29/10* (2013.01); *C08L 63/00* (2013.01); *C08L 71/12* (2013.01); *C09D 4/00* (2013.01); *C08G 2261/1642* (2013.01); *C08G 2261/1644* (2013.01); *C08G 2650/22* (2013.01); *C08J 2329/10* (2013.01); *C08J 2471/12* (2013.01); *C08K 2003/2227* (2013.01); *H05K 1/0373* (2013.01); *H05K 2201/0209* (2013.01)

(58) Field of Classification Search
None
See application file for complete search history.

(56) References Cited

U.S. PATENT DOCUMENTS

| | | | |
|---|---|---|---|
| 4,920,164 A * | 4/1990 | Sasaki | C08K 3/36 523/466 |
| 6,294,010 B1 * | 9/2001 | Pfaff | C08K 9/02 106/415 |
| 6,646,102 B2 | 11/2003 | Boriack et al. | |
| 6,835,785 B2 | 12/2004 | Ishii et al. | |
| 7,049,388 B2 | 5/2006 | Boriack et al. | |
| 7,109,288 B2 | 9/2006 | Akatsuka et al. | |
| 7,662,307 B2 | 2/2010 | Chiou et al. | |
| 8,530,566 B2 | 9/2013 | Lin et al. | |
| 9,371,233 B2 | 6/2016 | Lin et al. | |
| 2006/0074149 A1 | 4/2006 | Boriack et al. | |

(Continued)

FOREIGN PATENT DOCUMENTS

| | | |
|---|---|---|
| CN | 101161721 A | 4/2008 |
| CN | 102675824 A | 9/2012 |

(Continued)

OTHER PUBLICATIONS

Taiwanese Office Action for Appl. No. 106145515 dated Oct. 24, 2018.

*Primary Examiner* — Michael J Feely
(74) *Attorney, Agent, or Firm* — Birch, Stewart, Kolasch & Birch, LLP

(57) ABSTRACT

A resin composition is provided, which includes 1 part by weight of (a) thermally conductive resin with a biphenyl group, 1.0 to 10.0 parts by weight of (b) polyphenylene oxide, 0.01 to 5.0 parts by weight of (c) hardener, and 0.1 to 5.0 parts by weight of (d) inorganic filler. (d) Inorganic filler is boron nitride, aluminum nitride, silicon nitride, silicon carbide, aluminum oxide, carbon nitride, octahedral carbon, or a combination thereof with a surface modified by iron-containing oxide. (d) Inorganic filler is sheet-shaped or needle-shaped.

17 Claims, No Drawings

(56) References Cited

U.S. PATENT DOCUMENTS

| | | | |
|---|---|---|---|
| 2006/0167189 A1* | 7/2006 | Mizuno | B32B 15/08 |
| | | | 525/396 |
| 2011/0073798 A1 | 3/2011 | Yeh et al. | |
| 2015/0218343 A1* | 8/2015 | Rose | C09C 1/48 |
| | | | 106/712 |
| 2017/0145247 A1 | 5/2017 | Ho et al. | |
| 2017/0158932 A1 | 6/2017 | Liu et al. | |
| 2017/0158933 A1* | 6/2017 | Wu | C09K 5/14 |

FOREIGN PATENT DOCUMENTS

| | | |
|---|---|---|
| CN | 101885812 B | 9/2013 |
| CN | 103649160 A | 3/2014 |
| CN | 105399946 A | 3/2016 |
| CN | 103842397 B | 4/2017 |
| JP | 5395155 B2 | 1/2014 |
| TW | I290565 B | 12/2007 |
| TW | I291480 B | 12/2007 |
| TW | I339424 B1 | 3/2011 |
| TW | I475103 B | 3/2015 |
| TW | I475387 B | 3/2015 |

\* cited by examiner

RESIN COMPOSITION, PREPREG, AND COPPER CLAD LAMINATE

CROSS REFERENCE TO RELATED APPLICATIONS

The present application is based on, and claims priority from, Taiwan Application Serial Number 106145515, filed on Dec. 25, 2017, the disclosure of which is hereby incorporated by reference herein in its entirety.

TECHNICAL FIELD

The technical field relates to a resin composition, and in particular it relates to thermally conductive resin with a biphenyl group, polyphenylene oxide, and inorganic filler of the resin composition.

BACKGROUND

Circuit boards and IC substrates produced for the optoelectronics and semiconductor industries are trending toward high-speed, high-density, intensive, and high integration because of the rise of the "Cloud", "Internet" and "Internet of things", enhancements of 4G and 5G communication technologies, and improvement in display technologies. The required properties of the circuit boards and the IC substrates of the future are not only low dielectric constant and high insulation, but also low dielectric loss and high thermal conductivity. For example, the copper foil substrate in a circuit board is concisely represented as copper foil/dielectric layer/copper foil, and the middle dielectric layer is usually composed of resin, glass fiber cloth, or insulation paper with low thermal conductivity. Therefore, the copper foil substrate has a poor thermal conductivity. In general, a large amount of thermally conductive powder is often added to the dielectric layer to increase the thermal conductivity of the dielectric layer. However, the resin between the thermally conductive powder is not thermally conductive, such that the thermally conductive effect of the thermally conductive powder dispersed in the resin is limited.

A novel thermally conductive resin collocated with the thermally conductive powder is called for to overcome the above issue and increase the thermal conductivity of the dielectric layer between the copper foils.

SUMMARY

One embodiment of the disclosure provides a resin composition, comprising 1.0 part by weight of (a) thermally conductive resin with a biphenyl group; 1.0 to 10.0 parts by weight of (b) polyphenylene oxide; 0.01 to 5.0 parts by weight of (c) hardener; and 0.1 to 3.0 parts by weight of (d) inorganic filler, wherein (d) inorganic filler is boron nitride, aluminum nitride, silicon nitride, silicon carbide, aluminum oxide, carbon nitride, octahedral carbon, or a combination thereof with a surface modified by iron-containing oxide, and (d) inorganic filler is sheet-shaped or needle-shaped.

One embodiment of the disclosure provides a prepreg, being formed by magnetically aligning and curing a precursor, wherein the precursor is formed by impregnating a reinforcing material into the above resin composition.

One embodiment of the disclosure provides a copper clad laminate, including the above prepreg laminated to a copper foil.

A detailed description is given in the following embodiments.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are shown schematically in order to simplify the drawing.

One embodiment of the disclosure provides a resin composition, including (a) thermally conductive resin with a biphenyl group, (b) polyphenylene oxide, (c) hardener, and (d) inorganic filler. (b) Polyphenylene oxide amount is 1.0 to 10.0 parts by weight on the basis of 1.0 part by weight of (a) thermally conductive resin with a biphenyl group. A ratio of (b) polyphenylene oxide that is too high may result a cured resin composition to have a poor thermal conductivity. A ratio of (b) polyphenylene oxide that is too low may result the cure resin composition to have poor electrical properties such as dielectric constant (Dk) and dielectric loss (Df). (c) Hardener amount is 0.01 to 5.0 parts by weight on the basis of 1.0 part by weight of (a) thermally conductive resin with a biphenyl group. A ratio of (c) hardener that is too high may result in a substrate including the cured resin composition to have poor physical properties due to an insufficient cross-linking degree of the cured resin composition. (d) Inorganic filler amount is 0.1 to 3.0 parts by weight on the basis of 1.0 part by weight of (a) thermally conductive resin with a biphenyl group. A ratio of (d) inorganic filler that is too high may reduce the tensile strength of the substrate including the cured resin composition. Furthermore, the substrate is easily burst. A ratio of (d) inorganic filler that is too low may result in a poor thermally conductivity of the cured resin composition.

(d) Inorganic filler is boron nitride, aluminum nitride, silicon nitride, silicon carbide, aluminum oxide, carbon nitride, octahedral carbon, or a combination thereof with a surface modified by iron-containing oxide, and (d) inorganic filler is sheet-shaped or needle-shaped. In one embodiment, (d) inorganic filler can be prepared as disclosed in Taiwan Patent No. I588251. Alternatively, 0.01% to 10.0% parts by weight of a coupling agent (on the basis of 1.0 part by weight of (a) thermally conductive resin with a biphenyl group) is added to the resin composition to increase the compatibility between (d) inorganic filler and the other inorganic materials in the resin composition. Too much coupling agent may reduce physical properties of the substrate including the cured resin composition. In one embodiment, the coupling agent can be silane, titanate, zioconate, or a combination thereof. For example, the silane may include amino group, epoxy group, acrylic acid group, vinyl group, or a combination thereof. In a further embodiment, the coupling agent can be firstly mixed with (d) inorganic filler to add (e.g. graft) the coupling agent onto the surface of (d) inorganic filler. As such, the compatibility between (d) inorganic filler and the other inorganic materials in the resin composition can be further improved.

In one embodiment, (a) thermally conductive resin with a biphenyl group has terminal alkylene groups, and its chemical structure is shown in Formula 1.

(Formula 1)

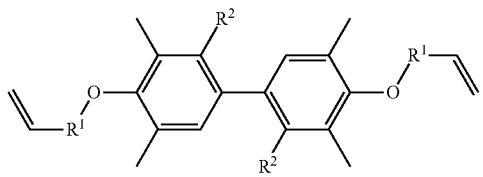

In Formula 1, $R^1$ is —$CH_2$—, —$C(=O)$—, or —$(CH_2)$—$(C_6H_4)$—, and $R^2$ is H or $CH_3$. For example, (a) thermally conductive resin with a biphenyl group may have a chemical structure shown in Formula 2, 3, or 4.

(Formula 2)

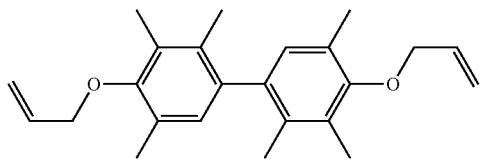

(Formula 3)

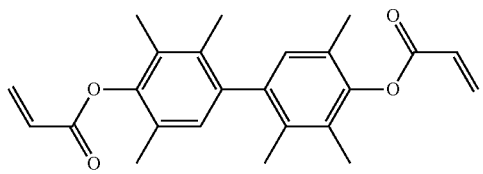

(Formula 4)

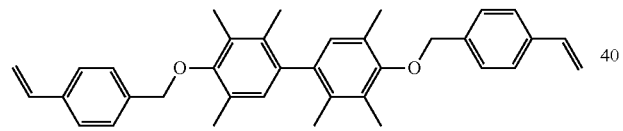

In this embodiment, (b) polyphenylene oxide also has terminal alkene groups, and its chemical structure is shown in Formula 5.

(Formula 5)

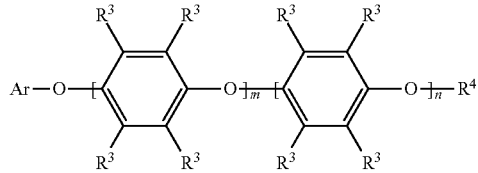

In Formula 5, Ar is aromatic group. Each of $R^3$ is independently of H, $CH_3$, $R^4$ is

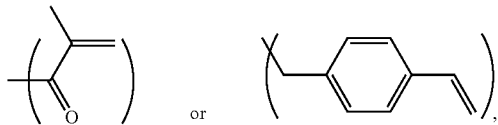

m and n are positive integers, and m+n=6~300. In one embodiment, (b) polyphenylene oxide has a weight average molecular weight of 1000 to 7000. (b) Polyphenylene oxide having a weight average molecular weight that is too high may result in poor mechanical properties of the substrate including the cured resin composition due to the poor solubility and too few reactive groups of the resin. (b) Polyphenylene oxide having a weight average molecular weight that is too low may result in a brittle substrate including the cured resin composition.

When (a) thermally conductive resin with a biphenyl group has terminal alkene groups and (b) polyphenylene oxide has terminal alkene groups, (c) hardener includes triallyl isocyanurate (TAIC), trivinyl amine, triallyl cyanurate (TAC), or a combination thereof. In this embodiment, the resin composition further includes 0.001 to 0.05 parts by weight of (e) radical initiator (on the basis of 1.0 part by weight of (a) thermally conductive resin with a biphenyl group). A ratio of (e) radical initiator that is too high may result in the molecular weight of the crosslinked resin composition that is too low, such that the physical properties of the substrate are poor. A ratio of (e) radical initiator that is too low may result in an insufficient curing degree of the substrate, such that the processability of substrate is not good. For example, (e) radical initiator can be photo initiator, thermal initiator, or a combination thereof.

In one embodiment, (a) thermally conductive resin with a biphenyl group has terminal epoxy groups, and its chemical structure is shown in Formula 6.

(Formula 6)

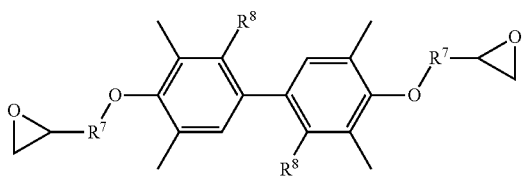

In Formula 6, $R^7$ is —$(CH_2)_n$— and n=1-3. $R^8$ is H or $CH_3$. In this embodiment, (b) polyphenylene oxide may have terminal hydroxyl groups, and its chemical structure is shown in Formula 7.

(Formula 7)

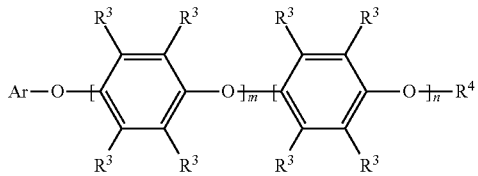

In Formula 7, Ar is aromatic group, each of $R^3$ is independently of H, $CH_3$,

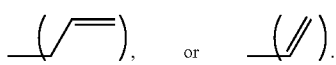

$R^4$ is

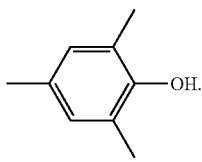

m and n are positive integers, and m+n=6~300. (b) Polyphenylene oxide having a weight average molecular weight that is too high may result in poor mechanical properties of the substrate including the cured resin composition due to the poor solubility and too few reactive groups of the resin. (b) Polyphenylene oxide having a weight average molecular weight that is too low may result in a brittle substrate including the cured resin composition.

When (a) thermally conductive resin with a biphenyl group has terminal epoxy groups and (b) polyphenylene oxide has terminal hydroxyl groups, (c) hardener includes active ester, multi-amine compound, multi-alcohol compound, or a combination thereof. For example, the active ester can be 8000-65T, 8150-60T, or 8100-65T commercially available from DIC. The multi-amine compound includes at least two amino groups, and multi-alcohol compound includes at least two hydroxyl groups. For example, the multi-amine compound can be 4,4'-diamino diphenyl sulfone (DDS), JER-113, or 4,4'-methylenedianiline (DDM). The multi-alcohol compound can be ethylene glycol, propylene glycol, or poly(ethylene glycol).

In one embodiment, (a) thermally conductive resin with a biphenyl group has terminal epoxy groups, and its chemical structure is shown in Formula 6. (b) polyphenylene oxide has terminal alkene groups, and its chemical structure is shown in Formula 5. Therefore, the resin composition should include 1.0 to 10.0 parts by weight of (f) compatibilizer, and its chemical structure is shown in Formula 8.

(Formula 8)

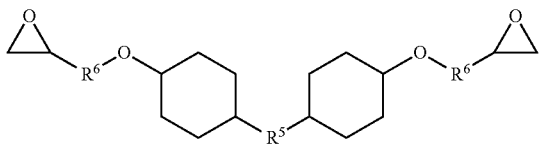

In Formula 8, $R^5$ is —CH2- or —C(CH$_3$)$_2$—, $R^6$ is —(CH$_2$)$_n$— and n is 1 to 3. A ratio of (f) compatibilizer that is too high results in a poor thermal conductivity of the cured resin composition or the substrate including the cured resin composition. A ratio of (f) compatibilizer that is too low results in the phase separation between (a) thermally conductive resin with a biphenyl group and (b) polyphenylene oxide due to their incompatibility. In this embodiment, (c) hardener is DIC 8000-65T (active ester), amine, or phenol hardener for SA90 system (polyphenylene oxide having terminal hydroxyl groups), or common radical initiator (e.g. radical initiator) for SA9000 system (polyphenylene oxide having terminal alkene groups), or a combination thereof. In one embodiment, reinforcing material can be impregnated in the resin composition. The resin composition is then aligned by a magnetic field, and then cured to form a prepreg. In one embodiment, the reinforcing material includes glass, ceramic, carbon material, resin, or a combination thereof, and the reinforcing material has a manner of fiber, powder, sheet, fabric, or a combination thereof. For example, the reinforcing material is glass fiber cloth. In one embodiment, the glass fiber cloth is impregnated in the resin composition (A-stage). The glass fiber cloth impregnated in the resin composition was put into an external magnetic field system of 0.1 Tesla to 10 Tesla, and (d) inorganic filler is aligned by the magnetic field. The external magnetic field direction is perpendicular to the surface direction of the glass fiber cloth. In one embodiment, the alignment of the magnetic field is performed for 0.01 seconds to 300 seconds. A higher intensity of the external magnetic field needs a shorter magnetic alignment period, and vice versa. However, strength of the external magnetic field that is too high will dramatically increase the equipment cost. Strength of the external magnetic field that is too low will dramatically increase the magnetic alignment period. The magnetic aligned glass fiber cloth is then put into an oven at 50° C. to 500° C. for curing the resin composition, thereby obtaining a prepreg (B-stage). The prepreg formed through the steps of magnetic alignment and curing has properties such as high thermal conductivity, low dielectric constant, low dielectric loss, and the like, which is suitable to be applied to a copper clad laminate. In one embodiment, the prepreg and a copper foil can be laminated to form a copper clad laminate. For example, a plurality of prepregs can be interposed between two copper foils, and the stacked structure can be then thermally laminated to form a copper clad laminate. The soldering resistance of the copper clad laminate can be tested, and not burst is occurred in the copper clad laminate.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

EXAMPLES

Synthesis Example 1

40 g of 4,4'-bi(2,3,6-trimethylphenol) (TMP-BP, commercially available from Mitsubishi Chemical) and 33.9 g of allyl chloride (commercially available from Echo Chemical Co., Ltd.) were added to 40 g of dimethylsulfoxide (DMSO, commercially available from Echo Chemical Co., Ltd.). Small amounts of tetra-n-butyl ammonium (commercially available from Echo Chemical Co., Ltd.) and sodium hydroxide were added to the above mixture, and the mixture was heated to 80° C. to react for 3 hours. After the reaction was completed, the reaction was cooled to room temperature, filtered, and purified to obtain a product. The chemical structure of the product is shown below.

(Formula 9)

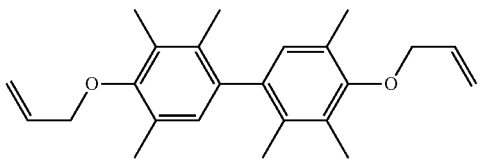

The hydrogen spectrum of the product is shown below:
$^1$H NMR (500 MHz, CDCl$_3$): δ6.69 (s, 2H), 6.12~6.04 (m, 2H), 5.39 (d, J=17.5 Hz, 2H), 5.20 (d, J=10.5 Hz, 2H), 4.25 (d, J=5.5 Hz, 4H), 2.18 (s, 6H), 2.16 (s, 6H), 1.83 (s, 6H).

Synthesis Example 2

40 g of TMP-BP and 40.22 g of acryloyl chloride (commercially available from Echo Chemical Co., Ltd.) were added to 100 g of tetrahydrofuran (THF). Small amounts of triethylamine (commercially available from Echo Chemical Co., Ltd.) and sodium hydroxide were added to the above mixture. The mixture was cooled to −30° C. to react, and then continuously stirred to room temperature. After the reaction was completed, the reaction was filtered, and purified to obtain a product. The chemical structure of the product is shown below.

(Formula 10)

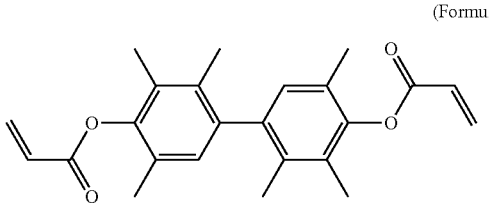

The hydrogen spectrum of the product is shown below:
$^1$H NMR (500 MHz, CDCl$_3$): δ6.85 (s, 2H), 6.66 (d, J=17.5 Hz, 2H), 6.40 (dd, J=17.5 Hz, J=10.5 Hz, 2H), 6.05 (d, J=10.5 Hz, 2H), 2.12 (s, 6H), 2.10 (s, 6H), 1.94 (s, 6H).

Synthesis Example 3

40 g of TMP-BP and 67.83 g of 4-vinylbenzyl chloride (commercially available from Echo Chemical Co., Ltd.) were added to 200 g of methyl ethyl ketone (MEK). Small amounts of tetra-n-butylammonium and potassium carbonate were added to the above mixture, and the mixture was heated to 90° C. to react for about 4 hours. After the reaction was completed, the reaction was cooled to room temperature, filtered, and purified to obtain a product. The chemical structure of the product is shown below.

(Formula 11)

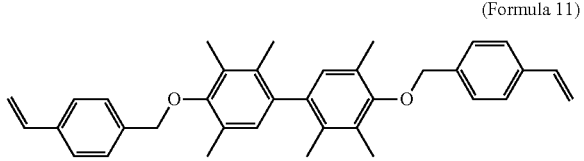 [SMILES: C=Cc1ccc(COc2c(C)cc(-c3cc(C)c(OCc4ccc(C=C)cc4)c(C)c3C)c(C)c2C)cc1]

The hydrogen spectrum of the product is shown below:
$^1$H NMR (500 MHz, CDCl$_3$): δ7.49~7.45 (m, 8H), 6.81 (s, 2H), 6.75 (dd, J=17.5 Hz, J=17.5 Hz, 2H), 5.78 (d, J=17.5 Hz, 2H), 5.27 (d, J=11 Hz, 2H), 4.83 (s, 4H), 2.30 (s, 6H), 2.28 (s, 6H), 1.94 (s, 6H).

Synthesis Example 4

According to Example 24 in Taiwan Patent No. I588251, magnetic and thermally conductive material was prepared, which was composed of a boron nitride powder having a surface partially coated by iron-containing oxide.

Synthesis Example 5

10 g of the magnetic and thermally conductive material prepared in Synthesis Example 4 and 0.05 g of silane Z6011 (commercially available from Dow Corning) were added to 250 mL of water to be mixed, thereby obtaining a magnetic and thermally conductive material containing silane.

Example 1-1

SA9000+ Thermally Conductive Resin in Synthesis Example 1

10.0 g of the product in Synthesis Example 1 serving as the thermally conductive resin with a biphenyl group (1.0 part by weight), 5.0 g of polyphenylene oxide with terminal alkylene groups SA9000 (commercially available from Sabic, having the chemical structure in Formula 5, in which m+n=6~300, 0.50 parts by weight), 5.2 g of triallyl isocyanurate (TAIC) serving as a hardener (0.52 parts by weight), 0.08 g of radical initiator 101 (commercially available from Aldrich, 0.008 parts by weight), and 11.4 g of the magnetic and thermally conductive material in Synthesis Example 4 (1.14 parts by weight) were added to 50 mL of co-solvent (toluene/propylene glycol methyl ether/butanone, v/v/v=6/2/2) and evenly mixed to form a resin composition.

A glass fiber cloth L-glass style 106 (commercially available from Asahi Kasei Co.) was impregnated into the resin composition. The glass fiber cloth containing the resin composition (A-stage) was magnetic aligned by an external magnetic field of 0.5 Tesla for a period of 30 seconds, in which the external magnetic field is perpendicular to the surface direction of the glass fiber cloth. The magnetic aligned glass fiber was put into an oven at 170° C. to cure the resin composition contained in the glass fiber cloth, thereby forming a prepreg (B-stage). The prepreg had a thickness of 0.08 mm, a thermal conductivity of 0.82 W/mK (measured using the standard ASTM-D5470), a dielectric constant of 3.47@10 GHz and a dielectric loss at 0.0059@10 GHz (measured using the standard JIS C2565).

The six prepregs are stacked between two copper foils. The above structure was thermally laminated at 170° C. to 210° C. to form a copper clad laminate. The soldering resistance of the copper clad laminate was tested at 340° C. for 10 seconds, and no burst occurred in the copper clad laminate.

Example 1-2

Example 1-2 was similar to Example 1-1, and the difference in Example 1-2 being that the product in Synthesis Example 1 was replaced with the product in Synthesis Example 2. The other compositions and ratios thereof, the steps of forming the prepreg and the copper clad laminate, and the property measurements of the prepreg and the copper clad were similar to those in Example 1-1, and the related descriptions are not repeated. The prepreg had a thickness of 0.08 mm, a thermal conductivity of 0.81 W/mK (measured using the standard ASTM-D5470), a dielectric constant of 3.50@10 GHz and a dielectric loss at 0.0061@10 GHz (measured using the standard JIS C2565). The soldering resistance of the copper clad laminate was tested, and no burst occurred in the copper clad laminate.

Example 1-3

Example 1-3 was similar to Example 1-1, and the difference in Example 1-3 being that the product in Synthesis Example 1 was replaced with the product in Synthesis Example 3. The other compositions and ratios thereof, the steps of forming the prepreg and the copper clad laminate, and the property measurements of the prepreg and the copper clad were similar to those in Example 1-1, and the related descriptions are not repeated. The prepreg had a thickness of 0.08 mm, a thermal conductivity of 0.84 W/mK (measured using the standard ASTM-D5470), a dielectric constant of 3.45@10 GHz and a dielectric loss at 0.0059@10 GHz (measured using the standard JIS C2565). The soldering resistance of the copper clad laminate was tested, and no burst occurred in the copper clad laminate.

Example 1-4

SA9000+m/BN 28.0 g of polyphenylene oxide with terminal alkylene groups SA9000 (commercially available from Sabic, having the chemical structure in Formula 5, in which m+n=6~300, 1.0 parts by weight), 12.0 g of TAIC serving as a hardener (0.43 parts by weight), 0.5 g of radical initiator 101 (commercially available from Aldrich, 0.017 parts by weight), 8.0 g of the magnetic and thermally conductive material in Synthesis Example 4 (0.29 parts by weight), and 14.5 g of silica Megasil525 (commercially available from Sibelco, 0.52 parts by weight) were added to 40 mL of co-solvent (toluene/xylene, v/v=6/4) and evenly mixed to form a resin composition.

The steps of forming the prepreg and the copper clad laminate, and the property measurements of the prepreg and the copper clad were similar to those in Example 1-1, and the related descriptions are not repeated. The prepreg had a thickness of 0.08 mm, a thermal conductivity of 0.635 W/mK (measured using the standard ASTM-D5470), a dielectric constant of 3.06@10 GHz and a dielectric loss at 0.0034@10 GHz (measured using the standard JIS C2565). The soldering resistance of the copper clad laminate was tested, and no burst occurred in the copper clad laminate.

Example 2

SA90+ YX4000

17.0 g of thermally conductive resin with a biphenyl group YX4000 (commercially available from Mitsubishi Chemical, having the chemical structure in Formula 6, in which $R^7$ is —$CH_2$— and $R^8$ is H, 1.0 part by weight), 25.0 g of polyphenylene oxide having terminal hydroxyl groups SA90 (commercially available from Sabic, having the chemical structure in Formula 7, in which m and n are positive integers and m+n=6~300, 1.5 parts by weight), 25.0 g of active ester 8000-65T serving as a hardener (commercially available from DIC, 1.47 parts by weight), 20.0 g of the magnetic and thermally conductive material in Synthesis Example 4 (1.2 parts by weight), and 15.0 g of silica Megasil525 (commercially available from Sibelco, 0.88 parts by weight) were added to 40 mL of co-solvent (toluene/butanone, v/v=4/6) and evenly mixed to form a resin composition.

The steps of forming the prepreg and the copper clad laminate, and the property measurements of the prepreg and the copper clad were similar to those in Example 1-1, and the related descriptions are not repeated. The prepreg had a thickness of 0.08 mm, a thermal conductivity of 0.779 W/mK (measured using the standard ASTM-D5470), a dielectric constant of 3.40@10 GHz and a dielectric loss at 0.0054@10 GHz (measured using the standard JIS C2565). The soldering resistance of the copper clad laminate was tested, and no burst occurred in the copper clad laminate over 60 minutes at 340° C. The tensile strength of the substrate was 4.63 lb/in (measured using the standard IPC-TM-650 2.4.8).

Example 3

SA9000+YX4000+YX8000

1500.0 g of thermally conductive resin with a biphenyl group YX4000 (commercially available from Mitsubishi Chemical, having the chemical structure in Formula 6, in which $R^7$ is —$CH_2$— and $R^8$ is H, 1.0 part by weight), 5000.0 g of polyphenylene oxide having terminal alkene groups SA9000 (commercially available from Sabic, having the chemical structure in Formula 5, in which m+n=6~300, 3.33 parts by weight), 1500.0 g of hydrogenated epoxy resin YX8000 serving as a compatibilizer (commercially available from Mitsubishi Chemical, having the chemical structure in Formula 8, in which $R^5$ is —$C(CH_3)_2$— and $R^6$ is —$CH_2$—, 1.0 part by weight), 900.0 g of multi-amine compound JER-113 serving as a hardener (commercially available from Mitsubishi Chemical, 0.6 parts by weight), 2100.0 g of TAIC serving as a hardener (1.5 parts by weight), 70.0 g of radical initiator 101 (0.05 parts by weight), and 6800.0 g of the magnetic and thermally conductive material containing silane in Synthesis Example 5 (4.6 parts by weight) were added to 9000 mL of co-solvent (toluene/propylene glycol methyl ether/butanone, v/v/v=6/2/2) and evenly mixed to form a resin composition. The chemical structure of the multi-amine compound JER-113 is shown in Formula 12.

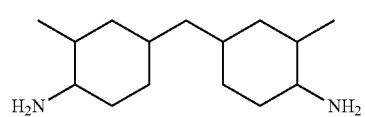

(Formula 12)

The steps of forming the prepreg and the copper clad laminate, and the property measurements of the prepreg and the copper clad were similar to those in Example 1-1, and the related descriptions are not repeated. The prepreg had a thickness of 0.08 mm, a thermal conductivity of 0.942 W/mK, a dielectric constant of 3.38@10 GHz and a dielectric loss at 0.0098@10 GHz (measured using the standard JIS C2565). The soldering resistance of the copper clad laminate was tested, and no burst occurred in the copper clad laminate.

Comparative Example 1

10.0 g of epoxy resin Epon 828 (commercially available from CHANG CHUN PLASTICS CO., LTD., 1 part by weight), 10.7 g of active ester 8000-65T serving as a hardener (commercially available from DIC, 1.07 parts by weight), and 13.8 g of the magnetic and thermally conductive material in Synthesis Example 4 (1.38 parts by weight) were added to 50 mL of co-solvent (toluene/propylene glycol methyl ether/butanone, v/v/v=6/2/2) and evenly mixed to form a resin composition.

The steps of forming the prepreg and the copper clad laminate, and the property measurements of the prepreg and the copper clad were similar to those in Example 1-1, and the related descriptions are not repeated. The prepreg had a thickness of 0.08 mm, a thermal conductivity of 0.45 W/mK (measured using the standard ASTM-D5470), a dielectric constant of 4.17@10 GHz and a dielectric loss at 0.010@10 GHz (measured using the standard JIS C2565). The soldering resistance of the copper clad laminate was tested, and no burst occurred in the copper clad laminate. Accordingly, the prepreg prepared from the resin composition of the disclosure had better properties than those of the prepreg prepared from the magnetic and thermally conductive material and the common epoxy resin.

Comparative Example 2

SA9000+BN 28.0 g of polyphenylene oxide having terminal alkene groups SA9000 (commercially available from Sabic, having the chemical structure in Formula 5, in which m+n=6~300, 1.0 parts by weight), 12.0 g of TAIC serving as a hardener (0.43 parts by weight), 0.5 g of radical initiator 101 (commercially available from Aldrich, 0.017 parts by weight), and 8.0 g of the boron nitride thermally conductive material (commercially available from Saint-Gobain, 0.29 parts by weight), and 14.5 g of silica Megasil525 (commercially available from Sibelco, 0.52 parts by weight) were added to 40 mL of co-solvent (toluene/xylene, v/v=6/4) and evenly mixed to form a resin composition.

The steps of forming the prepreg and the copper clad laminate, and the property measurements of the prepreg and the copper clad were similar to those in Example 1-1, and the related descriptions are not repeated. The prepreg had a thickness of 0.08 mm, a thermal conductivity of 0.575 W/mK (measured using the standard ASTM-D5470), a dielectric constant of 3.07@10 GHz and a dielectric loss at 0.0043@10 GHz (measured using the standard JIS C2565). The soldering resistance of the copper clad laminate was tested, and no burst occurred in the copper clad laminate. Accordingly, the prepreg prepared from the resin composition in Example 1-4 had better properties than those of the prepreg prepared from the thermally conductive material (not modified by the iron-containing oxide) and the polyphenylene oxide resin.

Comparative Example 3

17.0 g of thermally conductive resin with a biphenyl group YX4000 (commercially available from Mitsubishi Chemical, having the chemical structure in Formula 6, in which $R^7$ is —$CH_2$— and $R^8$ is H, 1.0 part by weight), 25.0 g of polyphenylene oxide having terminal hydroxyl groups SA90 (commercially available from Sabic, having the chemical structure in Formula 7, in which m and n are positive integers and m+n=6~300, 1.5 parts by weight), 25.0 g of active ester 8000-65T serving as a hardener (commercially available from DIC, 1.47 parts by weight), 30.0 g of the magnetic and thermally conductive material in Synthesis Example 4 (1.76 parts by weight), and 5.0 g of silica Megasil525 (commercially available from Sibelco, 0.29 parts by weight) were added to 40 mL of co-solvent (toluene/butanone, v/v=4/6) and evenly mixed to form a resin composition.

The steps of forming the prepreg and the copper clad laminate, and the property measurements of the prepreg and the copper clad were similar to those in Example 1-1, and the related descriptions are not repeated. The prepreg had a thickness of 0.08 mm, a thermal conductivity of 1.013 W/mK, a dielectric constant of 3.465@10 GHz and a dielectric loss at 0.0062@10 GHz. The soldering resistance of the copper clad laminate was tested, and burst occurred in the copper clad laminate for less than 10 seconds at 340° C. The copper clad laminate had a tensile strength of 3.37 lb/in. Accordingly, the prepreg prepared from the resin composition in Example 2 had better properties than those of the prepreg prepared from the magnetic and thermally conductive material that was too much, the polyphenylene oxide resin, and the thermally conductive resin.

It will be apparent to those skilled in the art that various modifications and variations can be made to the disclosed methods and materials. It is intended that the specification and examples be considered as exemplary only, with the true scope of the disclosure being indicated by the following claims and their equivalents.

What is claimed is:
1. A resin composition, comprising:
   1.0 part by weight of (a) thermally conductive resin with a biphenyl group;
   1.0 to 10.0 parts by weight of (b) polyphenylene oxide;
   0.01 to 5.0 parts by weight of (c) hardener; and
   0.1 to 3.0 parts by weight of (d) inorganic filler, wherein
   (d) inorganic filler is boron nitride, aluminum nitride, silicon nitride, silicon carbide, aluminum oxide, carbon nitride, octahedral carbon, or a combination thereof with a surface modified by iron-containing oxide, and
   (d) inorganic filler is sheet-shaped or needle-shaped, wherein (a) thermally conductive resin with the biphenyl group has terminal alkylene groups, which has a chemical structure of:

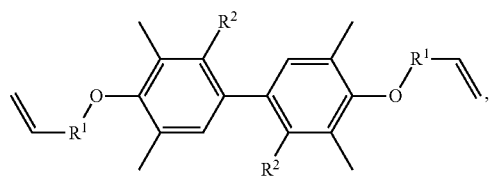

wherein
$R^1$ is —$CH_2$—, —$C(=O)$—, or —$(CH_2)$—$(C_6H_4)$—: and
$R^2$ is H or $CH_3$.

2. The resin composition as claimed in claim 1, wherein (b) polyphenylene oxide has terminal alkylene groups, which has a chemical structure of:

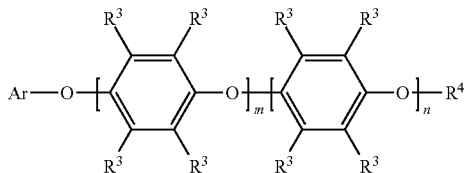

wherein Ar is aromatic group,
each of $R^3$ is independently of H, $CH_3$,

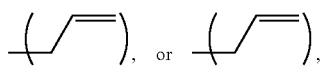

$R^4$ is

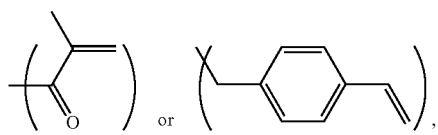

m and n are positive integers, and
m+n=6~300.

3. The resin composition as claimed in claim 1, wherein (c) hardener comprises triallyl isocyanurate, trivinyl amine, triallyl cyanurate, or a combination thereof.

4. The resin composition as claimed in claim 1, further comprising 0.001 to 0.05 parts by weight of (e) radical initiator.

5. The resin composition as claimed in claim 1, further comprising 0.01% to 10.0% parts by weight of coupling agent.

6. The resin composition as claimed in claim 5, wherein the coupling agent is added onto the surface of (d) inorganic filler.

7. A prepreg, being formed by magnetically aligning and curing a precursor, wherein the precursor is formed by impregnating a reinforcing material into the resin composition as claimed in claim 1.

8. The prepreg as claimed in claim 7, wherein the reinforcing material comprises glass, ceramic, carbon material, resin, or a combination thereof, and the reinforcing material has a manner of fiber, powder, flake, fabric, or a combination thereof.

9. A copper clad laminate, comprising:
the prepreg as claimed in claim 7 laminated to a copper foil.

10. A resin composition, comprising:
1.0 part by weight of (a) thermally conductive resin with a biphenyl group;
1.0 to 10.0 parts by weight of (b) polyphenylene oxide;
0.01 to 5.0 parts by weight of (c) hardener;
0.1 to 3.0 parts by weight of (d) inorganic filler; and
1.0 to 10.0 parts by weight of (f) compatibilizer,
wherein (d) inorganic filler is boron nitride, aluminum nitride, silicon nitride, silicon carbide, aluminum oxide, carbon nitride, octahedral carbon, or a combination thereof with a surface modified by iron-containing oxide, and (d) inorganic filler is sheet-shaped or needle-shaped, wherein (a) thermally conductive resin with a biphenyl group has terminal epoxy groups, which has a chemical structure of:

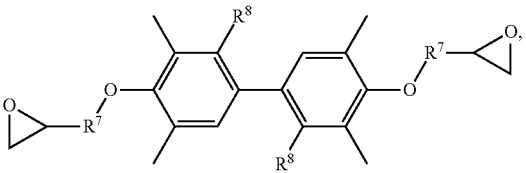

wherein $R^7$ is —$(CH_2)_n$—, and n=1~3, and
$R^8$ is H or $CH_3$,
wherein (f) compatibilizer has a chemical structure of:

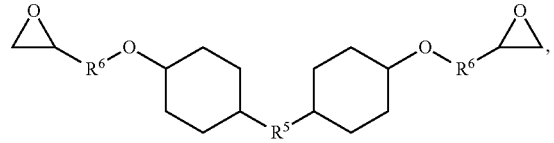

wherein $R^5$ is —$CH_2$— or —$C(CH_3)_2$—; and
$R^6$ is —$(CH_2)_n$— and n=1~3,
wherein (b) polyphenylene oxide has terminal alkylene groups, which has a chemical structure of:

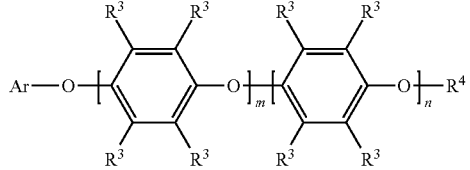

wherein Ar is aromatic group,
each of $R^3$ is independently of H, $CH_3$,

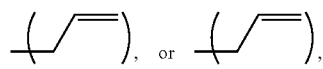

$R^4$ is

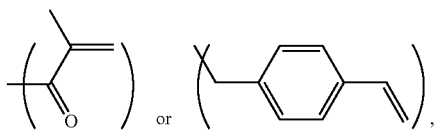

m and n are positive integers, and
m+n=6~300.

11. The resin composition as claimed in claim 10, wherein (c) hardener includes (c1) triallyl isocyanurate, trivinyl amine, triallyl cyanurate, or a combination thereof and (c2) active ester, multi-amine compound, multi-alcohol compound, or a combination thereof.

12. The resin composition as claimed in claim 10, further comprising 0.001 to 0.05 parts by weight of (e) radical initiator.

13. The resin composition as claimed in claim 10, further comprising 0.01% to 10.0% parts by weight of coupling agent.

14. The resin composition as claimed in claim 13, wherein the coupling agent is added onto the surface of (d) inorganic filler.

15. A prepreg, being formed by magnetically aligning and curing a precursor, wherein the precursor is formed by impregnating a reinforcing material into the resin composition as claimed in claim 10.

16. The prepreg as claimed in claim 15, wherein the reinforcing material comprises glass, ceramic, carbon material, resin, or a combination thereof, and the reinforcing material has a manner of fiber, powder, flake, fabric, or a combination thereof.

17. A copper clad laminate, comprising:
   the prepreg as claimed in claim 15 laminated to a copper foil.

\* \* \* \* \*